(12) United States Patent
Wu et al.

(10) Patent No.: US 10,847,492 B2
(45) Date of Patent: Nov. 24, 2020

(54) SEMICONDUCTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Jyun-Lin Wu, Hsinchu (TW); Liang-Chen Lin, Hsinchu County (TW); Shiang-Ruei Su, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 39 days.

(21) Appl. No.: 16/017,498

(22) Filed: Jun. 25, 2018

(65) Prior Publication Data

US 2019/0393186 A1    Dec. 26, 2019

(51) Int. Cl.
   *H01L 21/56*    (2006.01)
   *H01L 23/00*    (2006.01)
   *H01L 25/065*   (2006.01)

(52) U.S. Cl.
   CPC .............. *H01L 24/81* (2013.01); *H01L 24/13* (2013.01); *H01L 25/0657* (2013.01); *H01L 2224/1357* (2013.01); *H01L 2224/13083* (2013.01); *H01L 2224/13147* (2013.01); *H01L 2224/13155* (2013.01); *H01L 2224/13611* (2013.01); *H01L 2224/13647* (2013.01); *H01L 2224/81048* (2013.01); *H01L 2224/8181* (2013.01); *H01L 2924/0132* (2013.01)

(58) Field of Classification Search
   None
   See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,627,290 B2 | 4/2017 | Chen |
| 9,711,475 B2 | 7/2017 | Lin et al. |
| 2011/0001250 A1* | 1/2011 | Lin ................ H01L 23/49816 257/778 |
| 2011/0266667 A1* | 11/2011 | Wu ................. H01L 23/49811 257/737 |
| 2016/0035687 A1* | 2/2016 | Lin ..................... H01L 24/13 257/737 |

* cited by examiner

*Primary Examiner* — Joseph C. Nicely
*Assistant Examiner* — Lamont B Koo
(74) *Attorney, Agent, or Firm* — WPAT, P.C., Intellectual Property Attorneys; Anthony King (57) ABSTRACT

The present disclosure provides a semiconductor structure, including providing a first chip, disposing a first copper layer having a first thickness over a first side of the first chip, and disposing a first solder having a second thickness over the first copper layer, wherein a ratio of the second thickness and the first thickness is in a range of from about 2 to about 3.5.

20 Claims, 10 Drawing Sheets

SEMICONDUCTOR STRUCTURE AND MANUFACTURING METHOD FOR THE SAME

BACKGROUND

In the formation of 3DIC stacking structures, integrated circuits (IC) are formed at a surface of a semiconductor substrate and subsequently sawed and packaged.

Forming solder joints is one of the methods for joining IC chips to another chip, substrate, semiconductor structure, or the like. However, solder loss or cold joint may be induced after the joint process, further causing yield loss or poor reliability. Some of the failure may also be induced by certain thermal storage condition.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The problem of solder loss or cold joint is commonly found after the bonding operation due to excessive or insufficient amount of the solder material applied. For example, when too much solder material being applied, the excessive solder material can migrate toward the semiconductor chip along the connecting structure such as copper posts, causing substantial solder lost at the location originally applied. On the other hand, when too little solder material being applied, warpage effect may induce oxidation at the surfaces of the solder material prior to bonding, as a result, the joint property at the solder is significantly deteriorated to an extent of cold joint. Such problems may induce poor reliability, defects, disconnection, excessive intermetallic layer reacting with copper posts, or marginal loss/increase of resistance of the semiconductive structure. Some of the failure may also be induced by certain thermal storage condition. Present disclosure provides a semiconductor structure having an appropriate amount of solder material in order to help mitigating the aforesaid issues.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1:
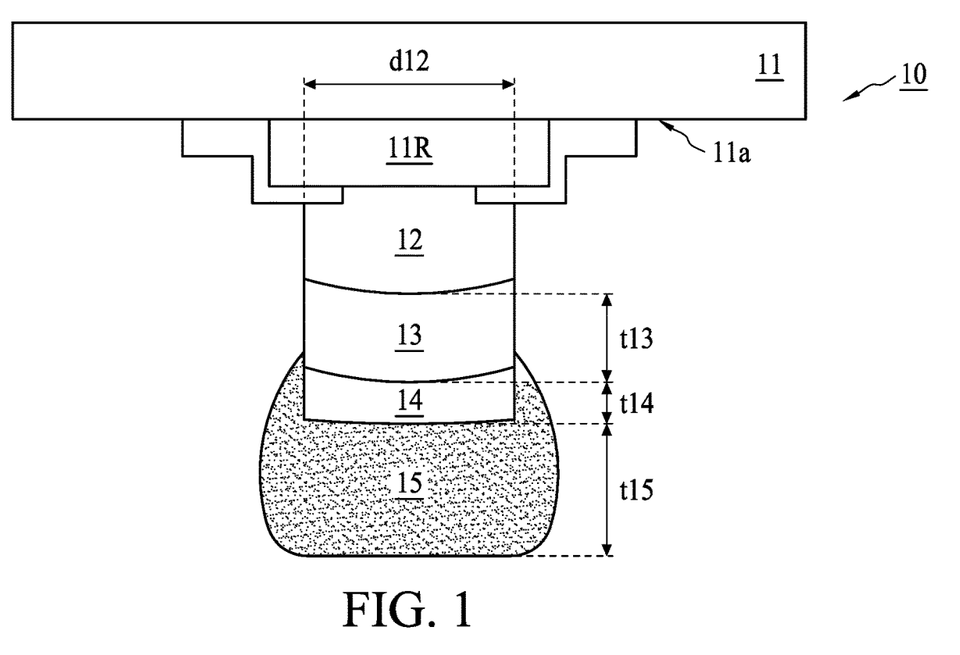
FIG. 1 is a cross section of a semiconductor structure, in accordance with some embodiments of the present disclosure.

Referring to FIG. 1, FIG. 1 is a cross section of a first semiconductor structure 10, in accordance with some embodiments of the present disclosure. The first semiconductor structure 10 includes a first chip 11 and a first metal layer 14 having a thickness t14 disposed over a first side 11a of the first chip 11. In some embodiments, the first chip can be a portion of a flip-chip structure or a 3D IC structure (not shown). The first semiconductor structure 10 further includes a first solder 15 having a thickness t15 disposed over the first metal layer 14. The first metal layer 14 may include copper. The first solder 15 may include a lead-free pre-solder layer formed of, for example, SnAg, or a solder material, including alloys of tin, lead, silver, copper, nickel, bismuth, or combinations thereof. In some embodiments, a ratio of the thickness t15 of the first solder 15 over the thickness t14 of the first metal layer 14 is in a range from about 2 to about 3.5. The criticality of the aforesaid ratio will be subsequently discussed in FIG. 6A to FIG. 8. In some embodiments, the thickness t14 of the first metal layer 14 is around 3 μm. In some embodiments, the thickness t15 of the first solder 15 is in a range from about 7 μm to about 10 μm. In some embodiments, the first chip 11 may include a first redistribution layer 11R, interconnect structure, metal line, passive devices, active devices, metal pads, metal vias, and/or other semiconductor structures. The first semiconductor structure 10 may further include a first copper post 12 between the first chip 11 and the first metal layer 14. For example, the first copper post 12 is electroplated over the first redistribution layer 11R over the first chip 11. In some embodiments, a diameter d12 of the first copper post 12 is a micro-bump and is in a range from about 15 μm to about 25 μm.

In some embodiments, the first semiconductor structure 10 may further include a first barrier layer 13 having a thickness t13 disposed between the first copper post 12 and the first metal layer 14. In some embodiments, a material of the first barrier layer 13 includes nickel-containing layer, for example, a nickel layer or a nickel alloy layer by plating. In some other embodiments, the first barrier layer 13 contains cobalt or tungsten. The first barrier layer 13 is disposed between the first copper post 12 and the first metal layer 14 in order to prevent the formation of excess intermetallic compound at the boundary of the first solder 15 and the first metal layer 14 by limiting the volume of the first metal layer 14 in the reaction. In some embodiments, the intermetallic compound can be $Cu_3Sn$ and, if generated with appropriate volume, can enhance the solder joint reliability. However, excess intermetallic compound can consume too much of the solder material and causing solder loss.

By limiting the formation of intermetallic compound, the volume of the first solder 15 can be preserved for solder joint operations. The thickness t13 of the first barrier 13 can be determined with several factors. For example, the desired aspect ratio of the copper post 12, the first barrier 13, and the first metal layer 14 can be taken into consideration. For another example, during solder joining operations, thickness t13 of the first barrier layer 13 is pivotal to prevent the solder material from accessing more copper material at the copper post 12 portion and forming excess intermetallic compound. Therefore, the wetting ability of the solder material along the first barrier layer 13 can be taken into account for designing the thickness t13.

Figure 2:
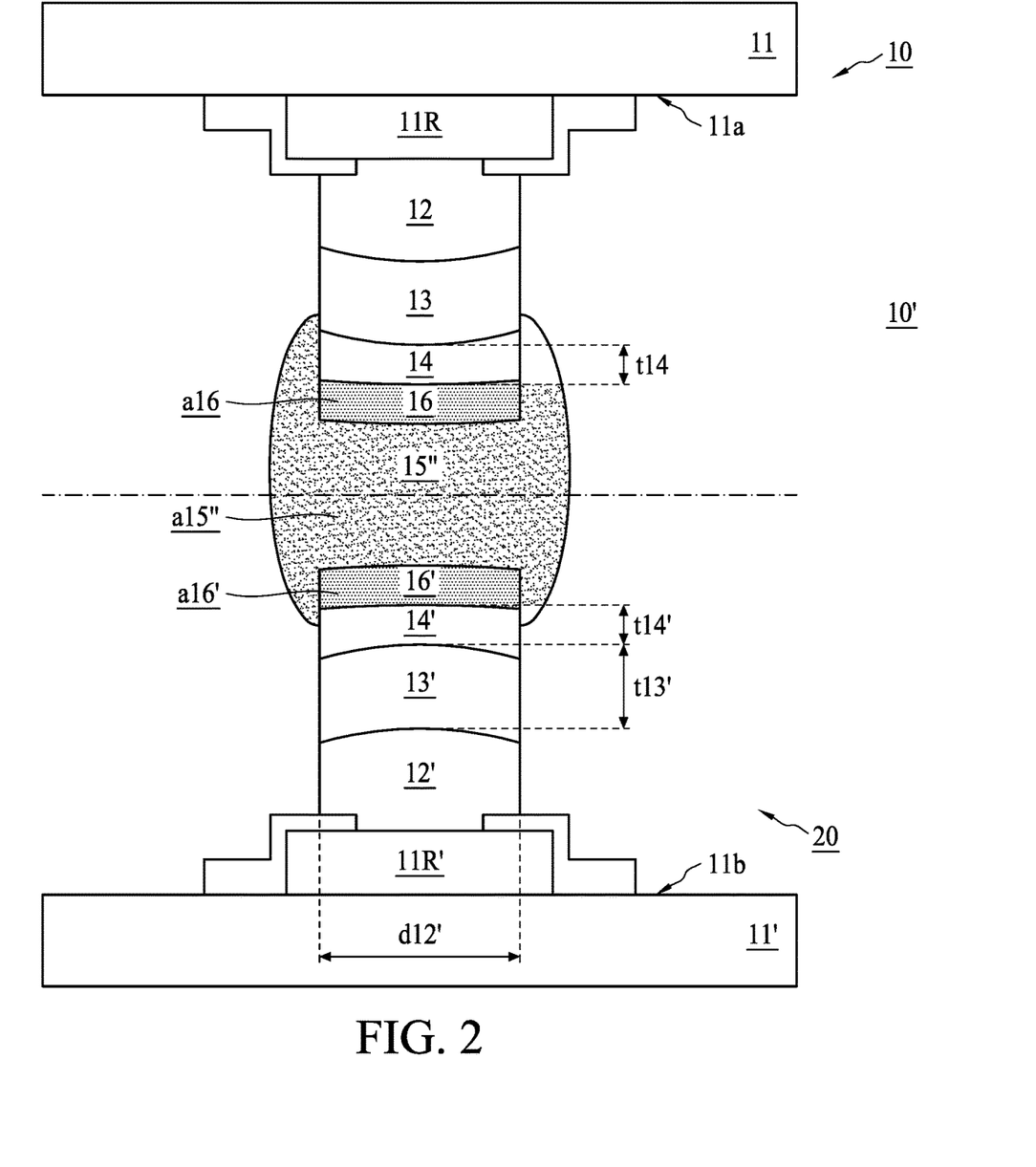
FIG. 2 is a cross section of a semiconductor structure, in accordance with some embodiments of the present disclosure.

The first chip 11 can be furtherly bonded to a second semiconductor structure 20 through a third solder 15″, as shown in FIG. 2. FIG. 2 is a cross section of a third semiconductor structure 10′. In some embodiments, the third solder 15″ is a structure resulting from joining the first chip 11 and the second chip 11′ by connecting the first solder 15 and the second solder 15′ (see FIG. 4). The second semiconductor structure 20 includes a second chip 11′ and a second metal layer 14′ having a thickness t14′ disposed over a second side 11b of the second chip 11′, wherein the second side 11b faces the first side 11a. In some embodiments, the second chip 11′ can be a portion of a flip-chip structure or a 3D IC structure (not shown). The second metal layer 14′ may include copper. The third solder 15″ is disposed between the first metal layer 14 and the second metal layer 14′. The third solder 15″ may include a lead-free pre-solder layer formed of, for example, SnAg, or a solder material, including alloys of tin, lead, silver, copper, nickel, bismuth, or combinations thereof. In some embodiments, the thickness t14′ of the second metal layer 14′ may be around 3 μm. In some embodiments, the second chip 11′ may include a second redistribution layer 11R′, interconnect structure, metal line, passive devices, active devices, metal pads, metal vias, and/or other semiconductor structures. The second semiconductor structure 20 may further include a second copper post 12′ between the second chip 11′ and the second metal layer 14′. For example, the second copper post 12′ is electroplated over the second redistribution layer 11R′ over the first chip 11. In some embodiments, a diameter d12′ of the second copper post 12′ is a micro-bump and is in a range from about 15 μm to about 25 μm.

In some embodiments, the second semiconductor structure 20 may further include a second barrier layer 13′ having a thickness t13′ disposed between the second copper post 12′ and the second metal layer 14′. In some embodiments, a material of the second barrier layer 13′ includes nickel-containing layer, for example, a nickel layer or a nickel alloy layer by plating. In some other embodiments, the first barrier layer 13 contains cobalt or tungsten. The second barrier layer 13′ is disposed between the second copper post 12′ and the second metal layer 14′ in order to prevent the formation of excess intermetallic compound at the boundary of the third solder 15″ and the second metal layer 14′ by limiting the volume of the second metal layer 14′ in the reaction. In some embodiments, the intermetallic compound can be $Cu_3Sn$ and, if generated with appropriate volume, can enhance the solder joint reliability. However, excess intermetallic compound can consume too much of the solder material and causing solder loss.

In some embodiments, the first semiconductor structure 10 further include a first intermetallic layer 16 between the first solder 15 and the first metal layer 14. The first intermetallic layer 16 may include an alloy formed by a combination of the first solder 15 and the first metal layer 14. In some embodiments, the first intermetallic layer 16 includes copper-tin alloy. In some embodiments, the second semiconductor structure 20 further include a second intermetallic layer 16′ between the third solder 15″ and the second metal layer 14′. The second intermetallic layer 16′ may include an alloy formed by a combination of the third solder 15″ and the second metal layer 14′. In some embodiments, the second intermetallic layer 16′ includes copper-tin alloy. In some embodiments, the first intermetallic layer 16 and the second intermetallic layer 16' are two separated regions. In some other embodiments, a region of the first intermetallic layer 16 and a region of the second intermetallic layer 16' are connected, thereby forming a continuous region. In some other embodiments, the first intermetallic layer 16 and the second intermetallic layer 16' may include a plurality of regions not showing any connection between each other from the cross sectional view.

In some embodiments, the third solder 15" may be a single layer. In some other embodiments, the third solder 15" may be separated by the first intermetallic layer 16 and/or the second intermetallic layer 16', thereby having more than two regions. In some embodiments, the third solder 15" may be surrounded by the first intermetallic layer 16 and/or the second intermetallic layer 16'. Perceiving from a cross sectional view, the first intermetallic layer 16 has a cross sectional area a16, the second intermetallic layer 16' has a cross sectional area a16', and the third solder 15' has a cross sectional area a15". In some embodiments, an area ratio of the sum of the cross sectional area a16 and the cross sectional area a16' over the cross sectional area a15" is in a range from about 0.1 to about 3. The criticality of the ratio will be subsequently discussed in FIG. 6A to FIG. 8.

Figure 3:
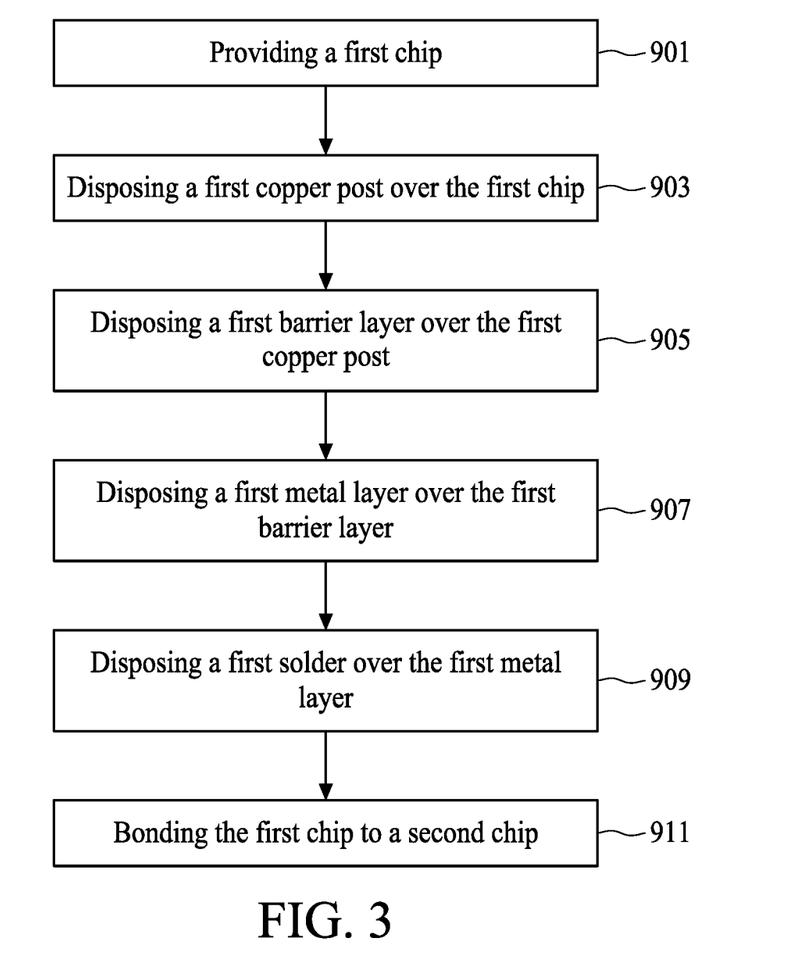
FIG. 3 is a flow chart representing methods for fabricating a semiconductor structure according to aspects of the present disclosure in one or more embodiments.
Figure 4:
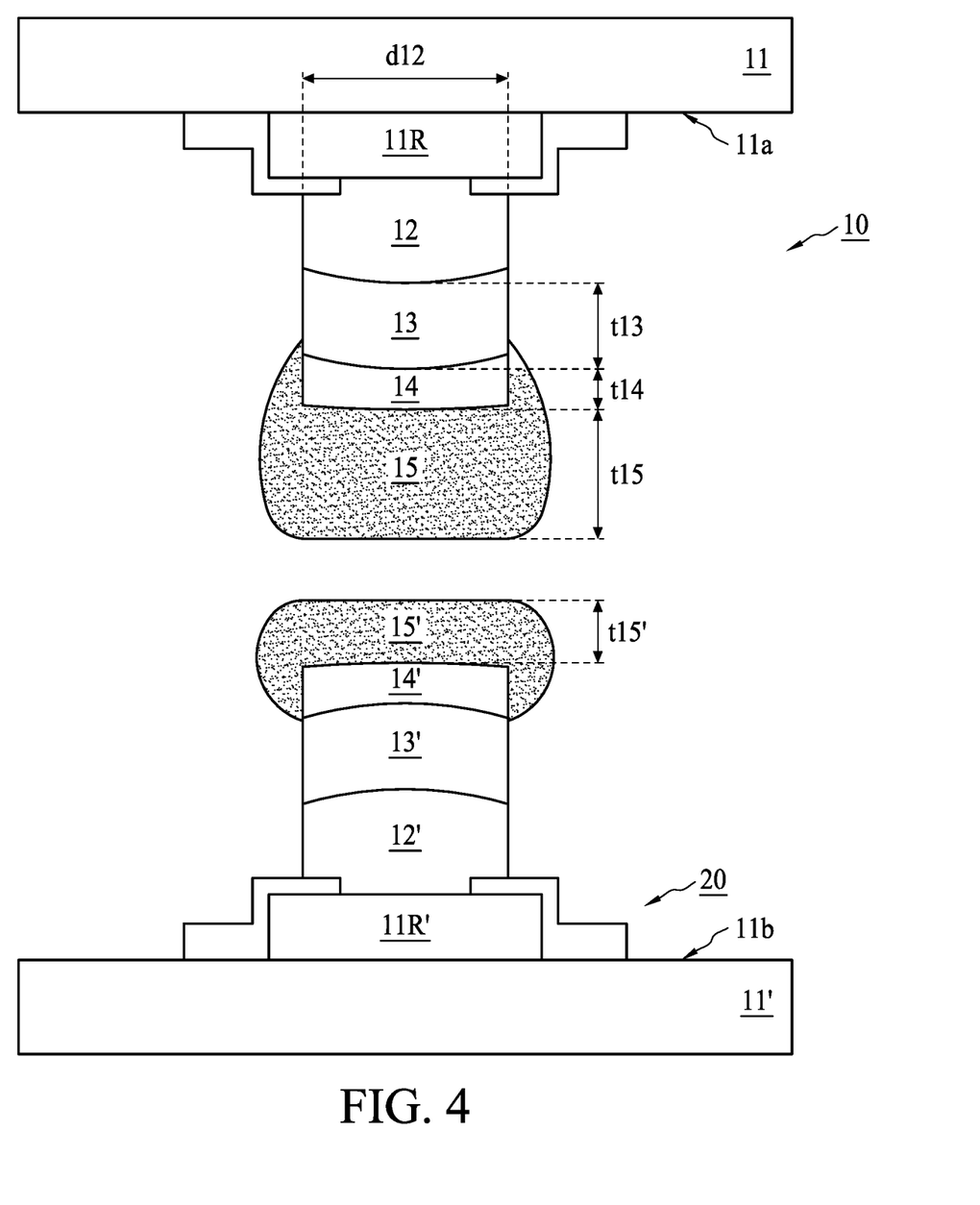
FIG. 4 is a cross section of a semiconductor structure during an intermediate stage of manufacturing operations, in accordance with some embodiments of the present disclosure.

FIG. 3 is a flow chart of fabricating a semiconductor device. FIG. 4 is a cross section of the first semiconductor structure 10 and the second semiconductor structure 20 during intermediate stages of manufacturing operations. Referring to FIG. 3 and FIG. 4, in operation 901, a first chip 11 is provided for fabricating the first semiconductor structure 10. In operation 903, the first copper post 12 is formed over the first chip 11 on the first side 11a. In some embodiments, the first copper post 12 is connected to the first redistribution layer 11R of the first chip 11. In some other embodiments, the first copper post 12 is connected to a metal pad, interconnect structure, metal line, passive devices, active devices, metal vias, and/or other semiconductor structures. In some embodiments, the first copper post 12 is a micro-bump and the diameter d12 of the first copper post 12 is in a range from about 15 µm to about 25 µm. In operation 905, the first barrier layer 13 is disposed over the first copper post 12. In some embodiments, the first barrier layer 13 is formed by plating. In operation 907, the first metal layer 14 is formed above the first barrier layer 13. In operation 909, the first solder 15 is disposed above the first metal layer 14. The first barrier layer 13 spaces between the first solder 15 and the first copper post 12. In some embodiments, a material a material of the first barrier layer 13 includes nickel-containing layer, for example, a nickel layer or a nickel alloy layer.

In some embodiments, a ratio of the thickness t15 of the first solder 15 over the thickness t14 of the first metal layer 14 is in a range from about 2 to about 3.5. The criticality of the aforesaid ratio will be subsequently discussed in FIG. 6A to FIG. 8. In some embodiments, the thickness t14 of the first metal layer 14 is around 3 µm. In some embodiments, the thickness t15 of the first solder 15 is in a range from about 7 µm to about 10 µm. In some embodiments, the first metal layer 14 includes copper. In some embodiments, the first solder 15 may include a lead-free pre-solder layer formed of, for example, SnAg, or a solder material, including alloys of tin, lead, silver, copper, nickel, bismuth, or combinations thereof. In some embodiments, the first solder 15 and the first chip 11 are annealed prior to bonding operation (which will be subsequently discussed in FIG. 5) in order to increase the cohesivity of the first solder 15 and improve the yield rate of bonding. In some embodiments, during the annealing operation, the thickness t15 of the first solder can be changed, for example, from 7 µm to about 5 µm, due to the elevated temperature causing a mild extent of reflow.

Still referring to FIG. 4, the second chip 11' is provided for fabricating the second semiconductor structure 20. Similar to the first chip 11, the second copper post 12' is formed over the second chip 11' on the second side 11b, wherein the second side 11b faces the first side 11a. In some embodiments, the second copper post 12' is connected to the second redistribution layer 11R' of the second chip 11'. In some other embodiments, the second copper post 12' is connected to a metal pad, interconnect structure, metal line, passive devices, active devices, metal vias, and/or other semiconductor structures. In some embodiments, the second copper post 12' is a micro-bump and the diameter d12' of the second copper post 12' is in a range from about 15 µm to about 25 µm. In some embodiments, the second barrier layer 13' is disposed over the second copper post 12'. In some embodiments, the second barrier layer 13' is formed by plating. The second metal layer 14' is formed above the second barrier layer 13'. A second solder 15' is disposed above the second metal layer 14'. The second barrier layer 13' spaces between the second solder 15' and the second copper post 12'. In some embodiments, a material of the second barrier layer 13' includes nickel. In some other embodiments, a material of the second barrier layer 13' may include nickel-containing layer, for example, a nickel layer or a nickel alloy layer. In some embodiments, a thickness t14' of the second metal layer 14' is around 3 µm. In some embodiments, a thickness t15' of the second solder 15' is less than the thickness t15 of the first solder 15, for example, the thickness t15' can be around 5 µm. The second metal layer 14' includes copper. In some embodiments, the second solder 15' may include a lead-free pre-solder layer formed of, for example, SnAg, or a solder material, including alloys of tin, lead, silver, copper, nickel, bismuth, or combinations thereof. In some embodiments, the second solder 15' may not be annealed prior to bonding operation.

Figure 5:
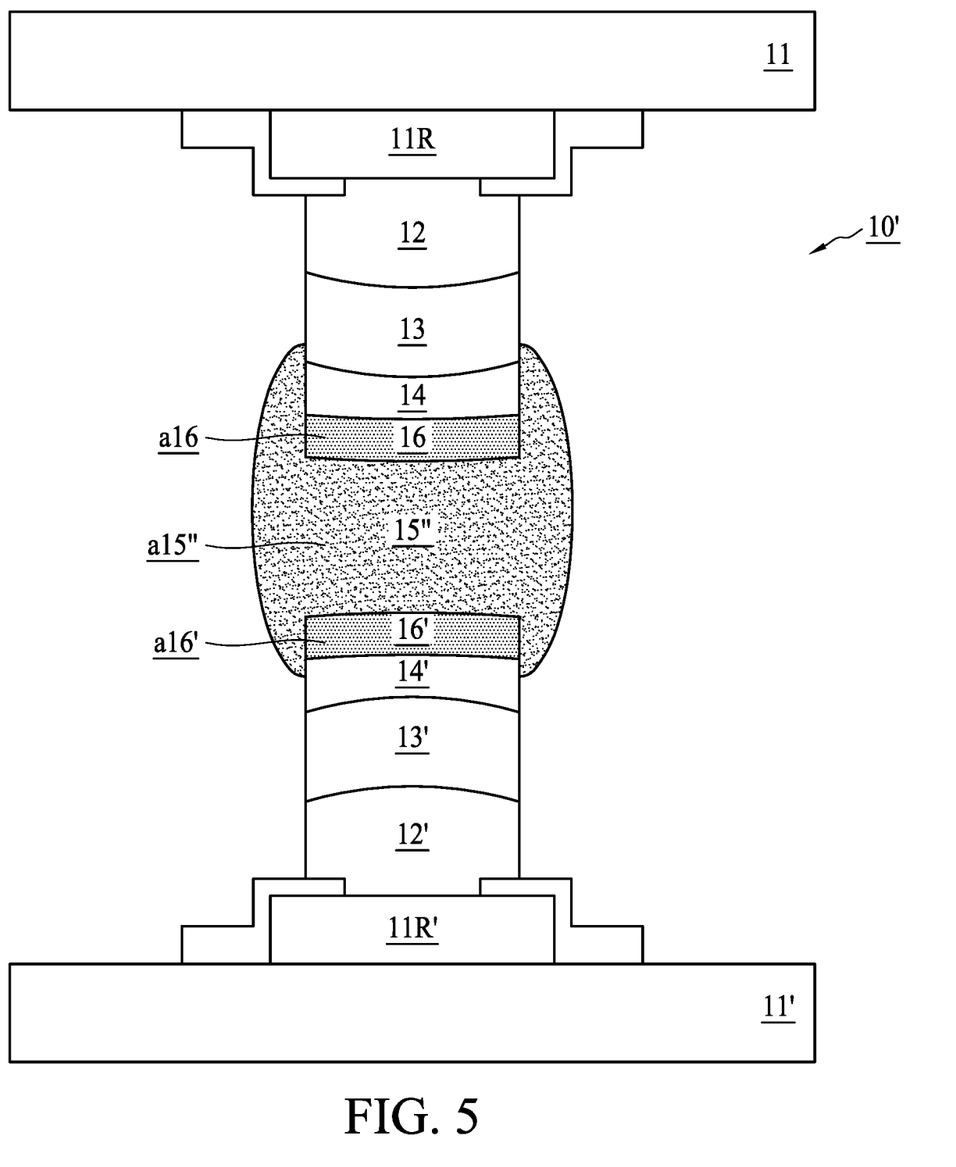
FIG. 5 is a cross section of a bonded semiconductor structure during an intermediate stage of manufacturing operations, in accordance with some embodiments of the present disclosure.

FIG. 5 is a cross section of third semiconductor structure 10' during intermediate stages of manufacturing operations. Referring to FIG. 3 and FIG. 5, in operation 911, the first semiconductor structure 10 and the second semiconductor structure 20 are bonded to form the third semiconductor structure 10'. In some embodiments, the first solder 15 is aligned to the second solder 15'. In some embodiments, flux is applied to the first semiconductor structure 10 and/or the second semiconductor structure 20 prior to the bonding operation. Flux is a chemical agent that helps mitigate oxidation of solders during the solder reflow process. The application of flux may include dipping or dispensing flux on the first copper post 12 and/or the second copper post 12'. As previously discussed, the first solder 15 along with the first chip 11 can be annealed prior to the bonding operation, while the second solder 15' along with the second chip 11' is not annealed. The first solder 15 and the second solder 15' are then bonded to form the third solder 15" via solder reflow operation after the flux application is completed, and flux is subsequently removed. In some embodiments, the first solder 15 and the second solder 15' are annealed during the operation 911.

In some embodiments, the first solder 15 reacts with the first metal layer 14 during the annealing under the operation 911, thereby the first intermetallic layer 16 is formed between the first metal layer 14 and the first solder 15. The first intermetallic layer 16 may include an alloy formed by a combination of the first solder 15 and the first metal layer 14. In some embodiments, the first intermetallic layer 16 includes copper-tin alloy. In some embodiments, the second solder 15' reacts with the second metal layer 14'; thereby the second intermetallic layer 16' is formed between the second metal layer 14' and the second solder 15'. The second intermetallic layer 16' may include an alloy formed by a combination of the second solder 15' and the second metal layer 14'.

In some embodiments, the second intermetallic layer 16' includes copper-tin alloy. In some embodiments, the first intermetallic layer 16 and the second intermetallic layer 16' are two separated regions. In some other embodiments, a region of the first intermetallic layer 16 and a region of the second intermetallic layer 16' are connected, thereby forming a continuous region. In some other embodiments, the first intermetallic layer 16 and the second intermetallic layer 16' may include a plurality of regions not showing any connection between each other from the cross sectional view. In some embodiments, the third solder 15" may be a single layer. In some embodiments, the third solder 15" may be separated by the first intermetallic layer 16 and/or the second intermetallic layer 16', thereby having more than two regions. In some embodiments, the third solder 15" may be surrounded by the first intermetallic layer 16 and/or the second intermetallic layer 16'. In some embodiments, perceiving from a cross sectional view, the first intermetallic layer 16 has the cross sectional area a16, the second intermetallic layer 16' has the cross sectional area a16', and the third solder 15' has the cross sectional area a15'. In some embodiments, an area ratio of the sum of the cross sectional area a16 and the cross sectional area a16' over the cross sectional area a15' is in a range from about 0.1 to about 3, as the criticality of the ratio will be subsequently discussed in FIG. 6A to FIG. 8.

One of the operations for assessing the reliability of the bonded structure is high-temperature storage (HTS) test. The HTS test may help determining the effect on devices of long-term storage at elevated temperatures by activating thermal failure mechanism. For example, excessive growth of the intermetallic layer can deteriorate the solder joints reliability in a way of solder loss. The long-term reliability can be determined by assessing the electrical features or physical features of the bonded structure, such as resistance, cracks, overflow, over-expansion, disconnection, defects, or other pertinent features.

Figure 6A:
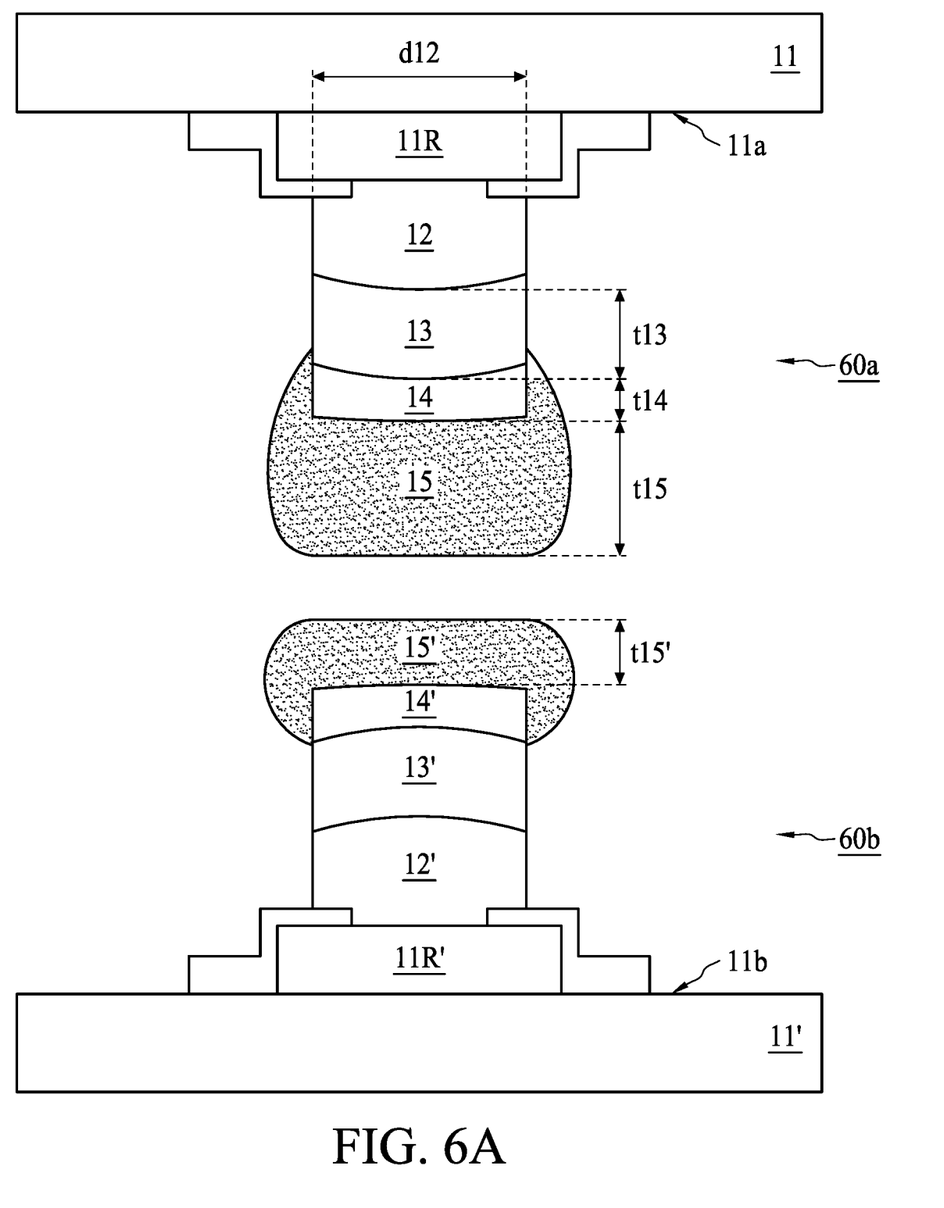
FIG. 6A is a cross section of a semiconductor structure having a thickness ratio (t15/t14) different from embodiments of present disclosure.
Figure 6B:
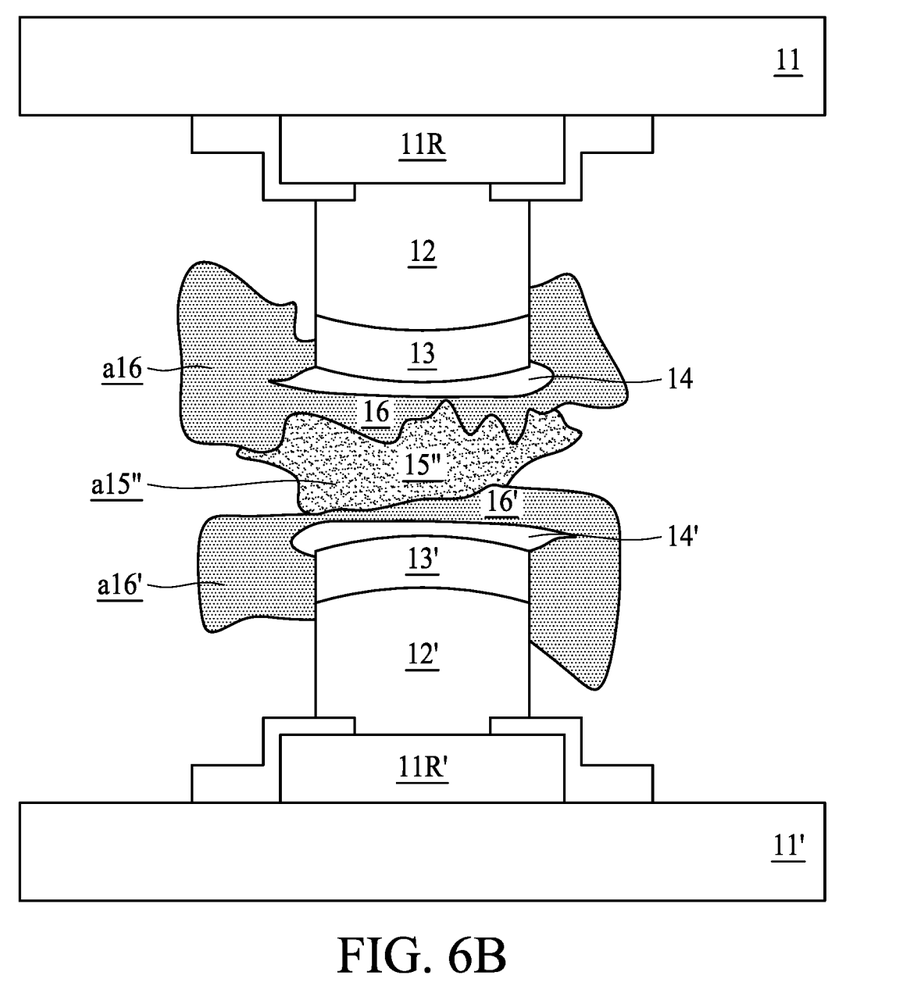
FIG. 6B is a cross section of a bonded semiconductor structure based on FIG. 6A.

FIG. 6A is a cross section of a semiconductor structure 60a and a semiconductor structure 60b having a thickness ratio (t15/t14) different from embodiments of present disclosure. FIG. 6B is a cross section of a bonded semiconductor structure based on FIG. 6A. FIG. 6A and FIG. 6B are to demonstrate a solder joint resulted from a thickness ratio (t15/t14) different from those of the present disclosure. The structure of the semiconductor structure 60a and the semiconductor structure 60b are respectively similar to the first semiconductor structure 10 and the second semiconductor structure 20 as previously discussed in FIG. 5. However, before bonding the first semiconductor structure 10 to the second semiconductor structure 20, the ratio of the thickness t15 of the first solder 15 over the thickness t14 of the first metal layer 14 is more than 3.5. Subsequent to bonding and/or annealing the first solder 15 and the second solder 15', the first intermetallic layer 16 and the second intermetallic layer 16' are formed between the first barrier layer 13 and the second barrier layer 13'. In current demonstration having the ratio t15/t14 more than 3.5, the first intermetallic layer 16 and/or the second intermetallic layer 16' are excessively formed and consuming too much of the third solder 15".

As shown in FIG. 6B, the excessive first intermetallic layer 16 and/or the excessive second intermetallic layer 16' may migrate across the first barrier layer 13 and/or the second barrier layer 13'. Thence the first intermetallic layer 16 and/or the second intermetallic layer 16' may contact with the first copper post 12 and/or the second copper post 12', further react with the first copper post 12 and/or the second copper post 12' throughout the operation of bonding or under the aforementioned HTS test. In addition, since a relatively high portion of the third solder 15" are consumed within the formation of the first intermetallic layer 16 and/or the second intermetallic layer 16', further causing necking phenomenon on the third solder 15", that is, a measurable width of the third solder 15" is significantly narrower than a measurable width of the intermetallic layer 16 and 16'. Necking may induce poor mechanical strength or marginal deviation of resistance of the semiconductive structure, causing poor reliability and/or low yield rate.

Figure 7A:
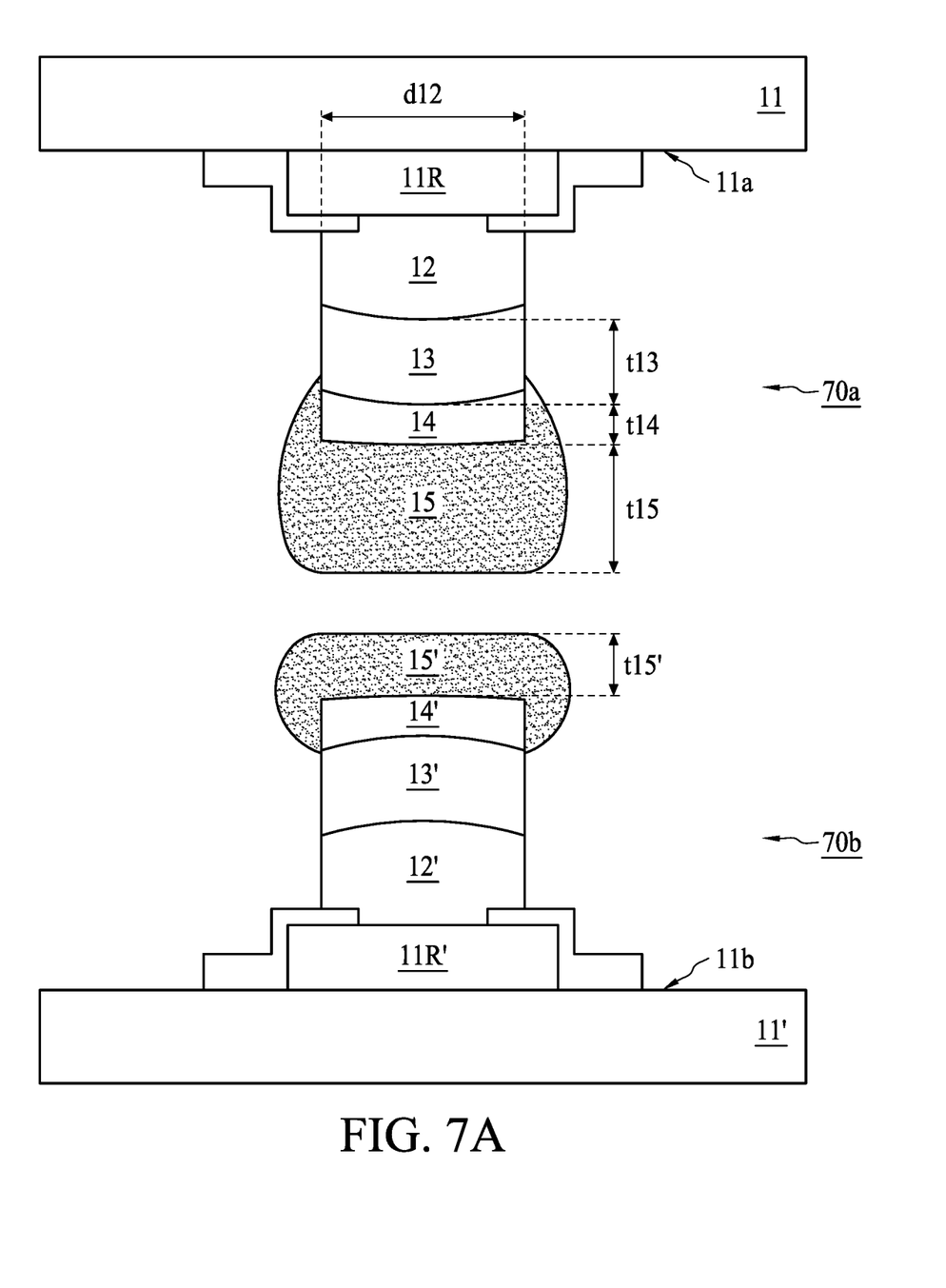
FIG. 7A is a cross section of a semiconductor structure having a thickness ratio (t15/t14) different from embodiments of present disclosure.
Figure 7B:
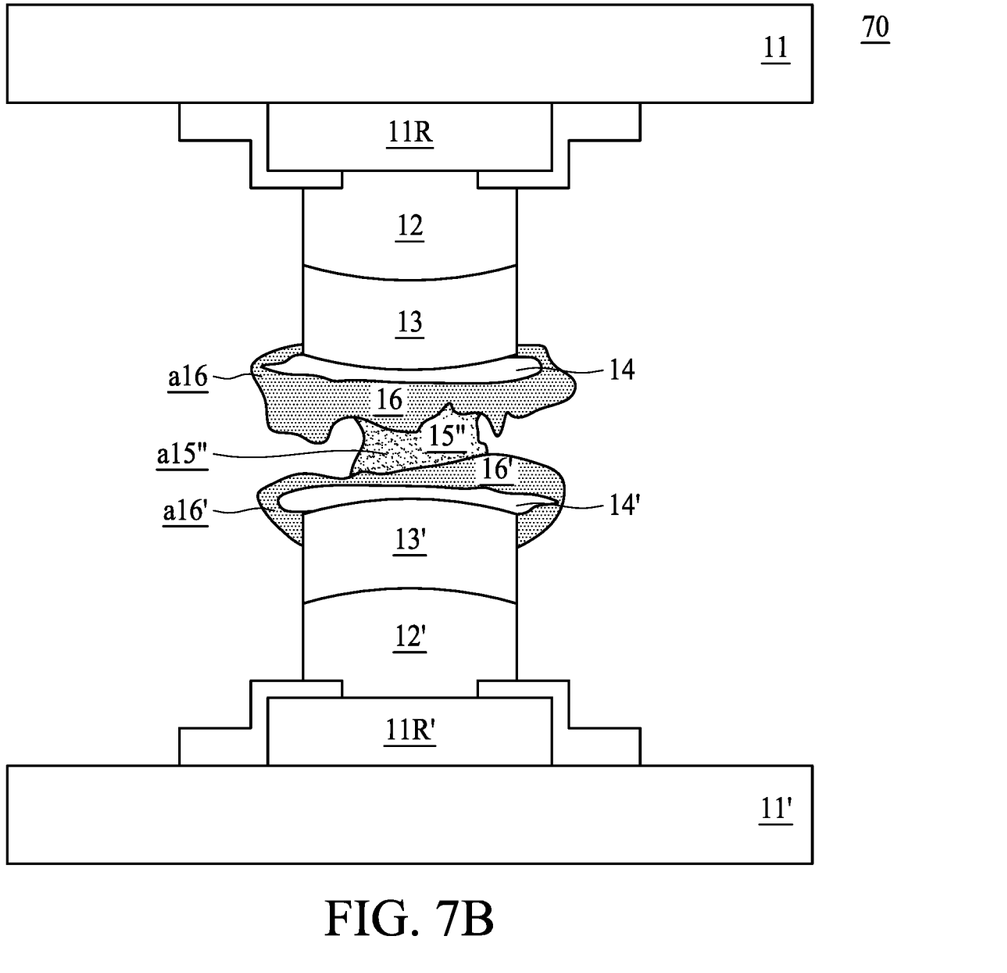
FIG. 7B is a cross section of a bonded semiconductor structure based on FIG. 7A.

FIG. 7A is a cross section of a semiconductor structure 70a having a thickness ratio (t15/t14) different from embodiments of present disclosures. FIG. 7B is a cross section of a bonded semiconductor structure based on FIG. 7A. FIG. 7A and FIG. 7B are to demonstrate a solder joint resulted from a thickness ratio (t5/t14) different from those of the present disclosure. The structure of the semiconductor structure 70a and the semiconductor structure 70b are respectively similar to the first semiconductor structure 10 and the second semiconductor structure 20 as previously discussed in FIG. 5. However, before bonding the first semiconductor structure 10 to the second semiconductor structure 20, the ratio of the thickness t15 of the first solder 15 over the thickness t14 of the first metal layer 14 is below 2. Subsequent to bonding and/or annealing the first solder 15 and the second solder 15', the first intermetallic layer 16 and the second intermetallic layer 16' are formed between the first barrier layer 13 and the second barrier layer 13'.

As shown in FIG. 7B, the insufficient first intermetallic layer 16 and/or the insufficient second intermetallic layer 16' may cause cold joint, that is, the first solder 15 and the second solder 15' does not merge completely or properly due to a surface oxide formation prior. Since the quantity of the third solder 15" is insufficient for the formation of the first intermetallic layer 16 and/or the second intermetallic layer 16', in some embodiments, only a relatively small portion of the third solder 15" may be remained, or the third solder 15" may even be completely consumed (not shown). After bonding operation or throughout the HTS test, cracks or disconnection may be found in cold joint, which may induce poor mechanical strength or marginal deviation of resistance of the semiconductive structure, causing poor reliability and/or low yield rate.

Figure 8:
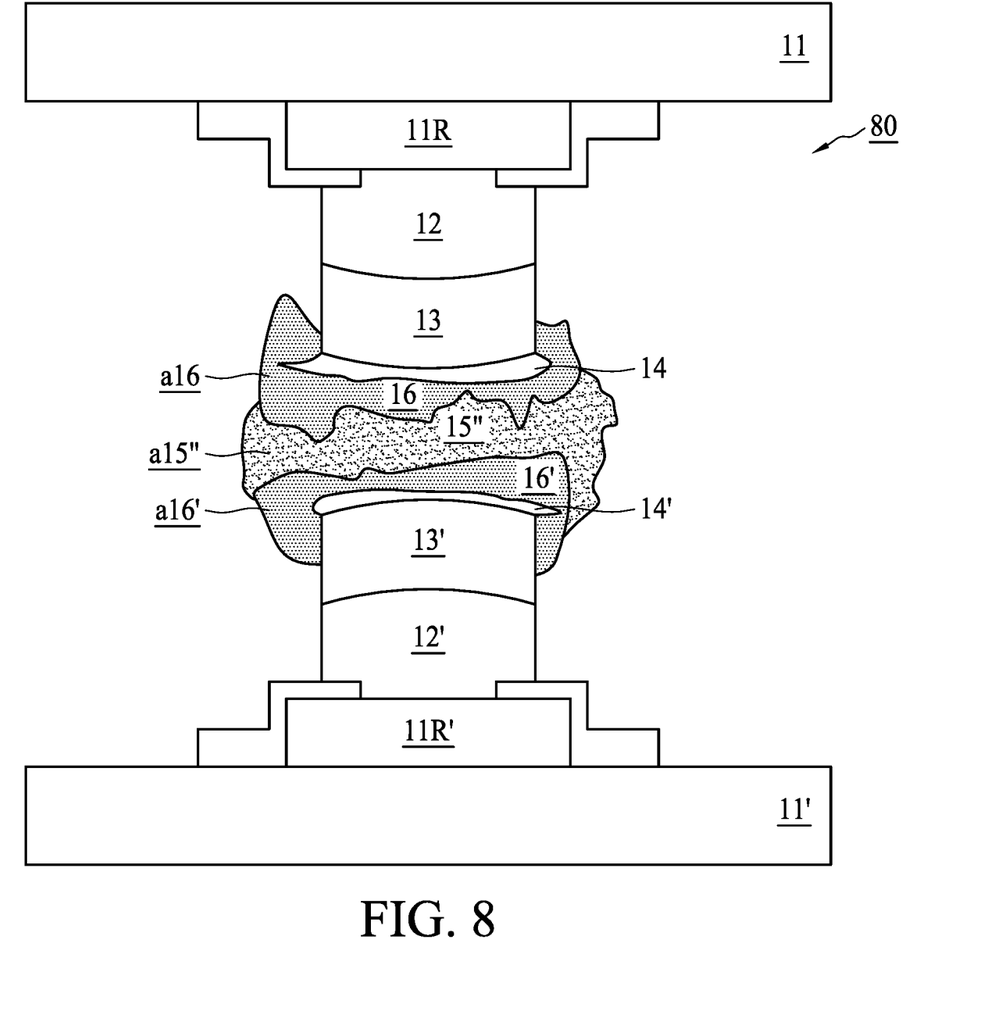
FIG. 8 is a cross section of a bonded semiconductor structure, in accordance with some embodiments of the present disclosure.

FIG. 8 is a cross section of a semiconductor structure 80 after bonding the first semiconductor structure 10 and the second semiconductor structure 20 as previously shown in FIG. 4. FIG. 8 and FIG. 4 are to demonstrate a solder joint resulted from a thickness ratio (t5/t14) within the range discussed in the present disclosure. As previously discussed in FIG. 4, before bonding the first semiconductor structure 10 to the second semiconductor structure 20, the ratio of the thickness t15 of the first solder 15 over the thickness t14 of the first metal layer 14 is in a range from about 2 to about 3.5. Subsequent to bonding and/or annealing the first solder 15 and the second solder 15', the first intermetallic layer 16 and the second intermetallic layer 16' are formed between the first barrier layer 13 and the second barrier layer 13'. In some embodiments, perceiving from a cross sectional view, the first intermetallic layer 16 has the cross sectional area a16, the second intermetallic layer 16' has the cross sectional area a16', and the third solder 15' has the cross sectional area a15'. In some embodiments, an area ratio of the sum of the cross sectional area a16 and the cross sectional area a16' over the cross sectional area a15' is in a range from about 0.1 to about 3.

As shown in FIG. 8, the quantity of the third solder 15" may help providing sufficient formation of the first intermetallic layer 16 and/or the second intermetallic layer 16', further mitigate the issues of cold joint, solder loss, marginal deviation of resistance of the semiconductive structure, or necking, and help improving mechanical strength, reliability, and/or yield rate.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a semiconductor structure, including (1) providing a first chip, disposing a first copper layer having a first thickness over a first side of the first chip, and (2) disposing a first solder having a second thickness over the first copper layer, wherein a ratio of the second thickness and the first thickness is in a range of from about 2 to about 3.5.

Some embodiments of the present disclosure provide a semiconductor structure, including (1) providing a first chip, wherein the first chip including a first copper layer having a first thickness over a first side of the first chip, and a first solder having a second thickness over the first copper layer, wherein a ratio of the second thickness over the first thickness is in a range from about 2 to about 3.5; (2) providing a second chip, wherein the second chip including a second copper layer over a second side of the second chip, and a second solder over the second copper layer; and (3) bonding the first chip over the second chip, wherein the first side faces the second side.

Some embodiments of the present disclosure provide a semiconductor structure, including a first chip including a first copper post on a first side of the first chip, a first barrier layer connected to the first copper layer, and a first metal layer on the first barrier layer, a second chip connected to the first chip, the second chip including a second copper layer over a second side of the second chip, the second side facing the first side, a second barrier layer connected to the second copper layer, and a second metal layer on the second barrier layer, an intermetallic layer between the first barrier layer and the second barrier layer, and a solder layer surrounded by the intermetallic layer, wherein an area ratio of the intermetallic layer and the solder layer, perceived from a cross section, is in a range from about 0.1 to about 3.

What is claimed is:

1. A method of manufacturing a semiconductor structure, comprising:
    providing a first chip;
    disposing a first copper post over a first side of the first chip;
    disposing a nickel layer over the first copper post;
    disposing a first copper layer having a first thickness over the nickel layer;
    disposing a first solder having a second thickness over the first copper layer; and
    bonding the first chip to a second chip via the first solder and a second solder of the second chip,
    wherein a ratio of the second thickness and the first thickness prior to bonding the first chip to a second chip is in a range of from about 2 to about 3.5.

2. The method of claim 1, wherein disposing the first copper post is performed prior to disposing the first copper layer, and the first copper post has a diameter of from about 15 μm to about 25 μm.

3. The method of claim 1, further comprising:
    providing the second chip;
    disposing a second copper layer over a second side of the second chip, the second side facing the first side;
    disposing the second solder having a third thickness over the second copper layer, wherein the third thickness is thinner than the second thickness.

4. The method of claim 3, further comprising annealing the first solder and the first chip prior to bonding the first chip to the second chip.

5. The method of claim 1, wherein the nickel layer is formed by plating after disposing the first copper post and prior to disposing the first copper layer.

6. The method of claim 1, wherein the first thickness is about 3 μm.

7. The method of claim 1, wherein the second thickness is in a range of from about 7 μm to about 10 μm.

8. The method of claim 4, further comprising forming an intermetallic layer between the first solder and the first copper layer during annealing the first solder and during bonding the first chip to the second chip.

9. A method of manufacturing a semiconductor structure, comprising:
    providing a first chip, wherein the first chip comprising:
        a first copper post over a first side of the first chip;
        a first nickel layer over the first copper post;
        a first copper layer having a first thickness over the first nickel layer; and
        a first solder having a second thickness over the first copper layer;
    providing a second chip, wherein the second chip comprising:
        a second copper layer over a second side of the second chip; and
        a second solder over the second copper layer; and
    bonding the first chip over the second chip,
    wherein the first side faces the second side, and a ratio of the second thickness over the first thickness prior to bonding the first chip to a second chip is in a range from about 2 to about 3.5.

10. The method of claim 9, further comprising annealing the first solder and the first chip prior to bonding the first chip to the second chip.

11. The method of claim 9, wherein disposing the first copper post is performed prior to disposing the first copper layer, and the first copper post has a diameter of from about 15 µm to about 25 µm; and the method further comprises:

disposing a second copper post prior to disposing the second copper layer.

12. The method of claim 11, wherein disposing the first nickel layer is performed after disposing the first copper post and prior to disposing the first copper layer; and the method further comprises:

disposing a second nickel layer after disposing the second copper post and prior to disposing the second copper layer.

13. The method of claim 9, wherein the first thickness is about 3 µm.

14. The method of claim 9, wherein the second thickness is in a range from 7 µm to about 10 µm.

15. The method of claim 9, further comprising forming an intermetallic layer between the first solder and the first copper layer during annealing the first solder and during bonding the first chip to the second chip.

16. The method of claim 9, further comprising forming an intermetallic layer between the second solder and the second copper layer during annealing the second solder and during bonding the first chip to the second chip.

17. A method of manufacturing a semiconductor structure, comprising:

providing a first chip having a first redistribution layer;

disposing a first copper layer having a first thickness over the first redistribution layer;

disposing a first solder having a second thickness over the first copper layer;

forming a first intermetallic layer between the first solder and the first copper layer;

bonding the first solder and a second solder of a second chip to form an integrated solder layer, wherein the second solder is over a second intermetallic layer over a second chip, and a ratio of the second thickness and the first thickness prior to bonding the first chip to a second chip is in a range of from about 2 to about 3.5;

wherein an area ratio of a sum of a first cross-sectional area of the first intermetallic layer and a second cross-sectional area of the second intermetallic layer over a third cross-sectional area of the integrated solder layer is in a range from about 0.1 to about 3.

18. The method of claim 17, further comprising:

disposing a first copper post between the first redistribution layer and the first copper layer, wherein the integrated solder layer is separated from the first copper post.

19. The method of claim 17, wherein the first intermetallic layer is formed from a portion of the first solder layer and the first copper layer by an annealing operation.

20. The method of claim 19, wherein the second thickness of the first solder is changed from about 7 µm to about 5 µm during the annealing operation.

* * * * *